United States Patent
Enman et al.

(10) Patent No.: US 12,305,275 B2
(45) Date of Patent: May 20, 2025

(54) CORROSION RESISTANT FILM ON A CHAMBER COMPONENT AND METHODS OF DEPOSITING THEREOF

(71) Applicant: Applied Materials, Inc., Santa Clara, CA (US)

(72) Inventors: Lisa J. Enman, Sunnyvale, CA (US); Steven D. Marcus, San Jose, CA (US); Mark J. Saly, Santa Clara, CA (US); Lei Zhou, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 18/368,202

(22) Filed: Sep. 14, 2023

(65) Prior Publication Data
US 2024/0003003 A1 Jan. 4, 2024

Related U.S. Application Data

(62) Division of application No. 16/935,658, filed on Jul. 22, 2020, now Pat. No. 11,932,938.

(60) Provisional application No. 62/898,088, filed on Sep. 10, 2019, provisional application No. 62/881,617, filed on Aug. 1, 2019.

(51) Int. Cl.
C23C 16/40 (2006.01)
C23C 16/455 (2006.01)

(52) U.S. Cl.
CPC ........ *C23C 16/40* (2013.01); *C23C 16/45553* (2013.01); *C23C 16/45555* (2013.01)

(58) Field of Classification Search
None
See application file for complete search history.

(56) References Cited

U.S. PATENT DOCUMENTS

| | | | |
|---|---|---|---|
| 6,743,475 B2 | 6/2004 | Skarp et al. | |
| 2007/0148350 A1 | 6/2007 | Rahtu et al. | |
| 2009/0149022 A1 | 6/2009 | Chan et al. | |
| 2015/0247235 A1 | 9/2015 | Kishi et al. | |
| 2018/0187304 A1* | 7/2018 | Liu | H01L 21/76883 |
| 2019/0157067 A1 | 5/2019 | Bhuyan et al. | |

FOREIGN PATENT DOCUMENTS

| | | | |
|---|---|---|---|
| JP | 2019116676 A | 7/2019 | |
| KR | 1020140052899 A | 5/2014 | |
| TW | 201623668 A | 7/2016 | |
| WO | WO-2019118248 A1 * | 6/2019 | ........... C23C 16/325 |

OTHER PUBLICATIONS

International Search Report and Written Opinion for PCT/US2020/043897 mailed Nov. 13, 2020, 10 pages.

* cited by examiner

*Primary Examiner* — Michael G Miller
(74) *Attorney, Agent, or Firm* — LOWENSTEIN SANDLER LLP

(57) ABSTRACT

Disclosed is a coated chamber component comprising a body having a reduced metal surface such that the reduced metal surface has less metal oxide as compared to an amount of metal oxide on a metal surface that has not been reduced. The metal surface may be reduced by pulsing a reducing alcohol thereon. The reduced metal surface may be coated with a corrosion resistant film that may be deposited onto the reduced metal surface by a dry atomic layer deposition process.

20 Claims, 5 Drawing Sheets

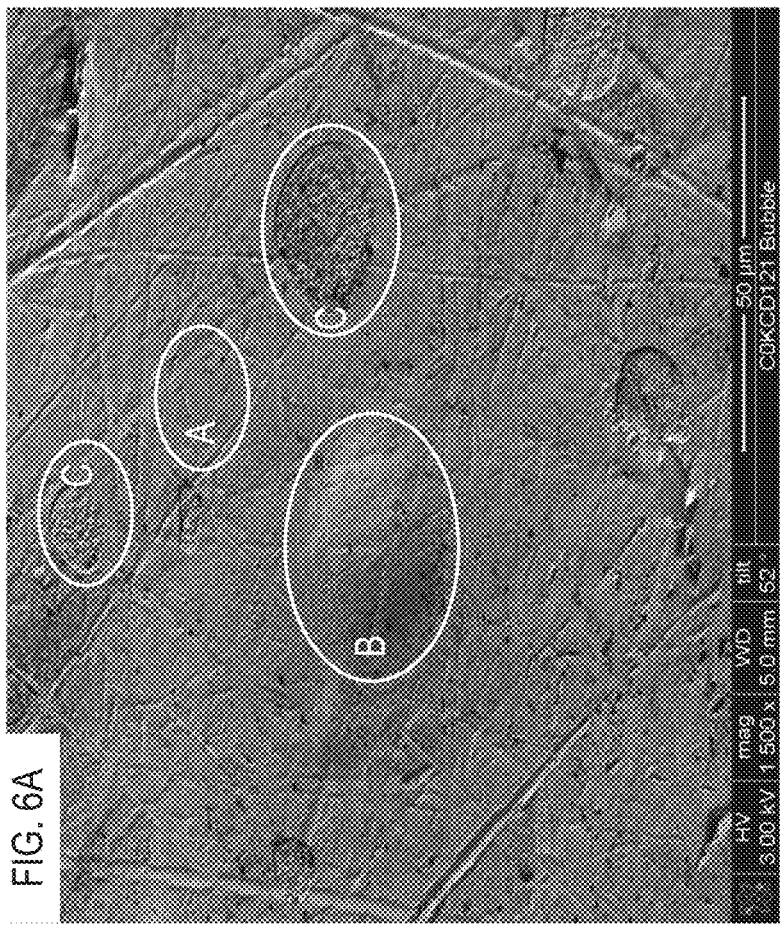
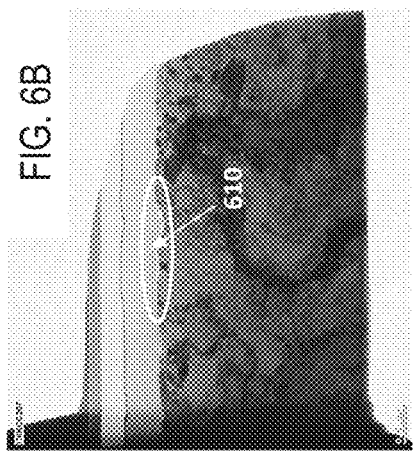
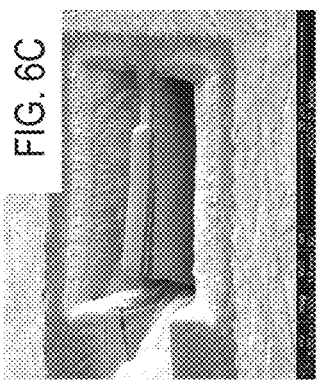
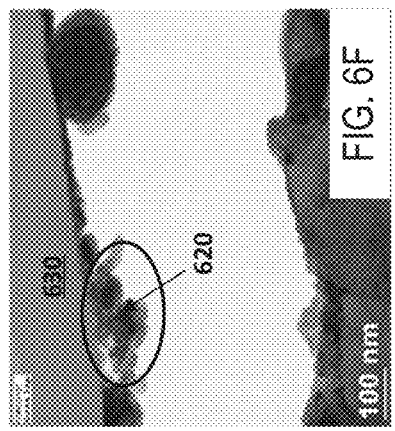
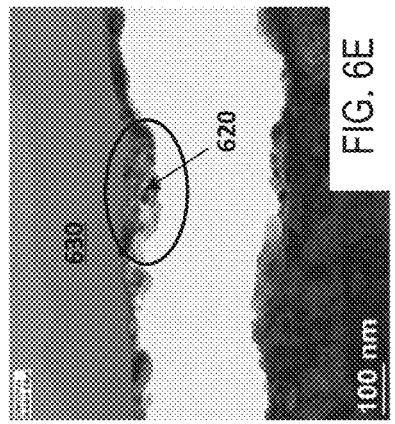
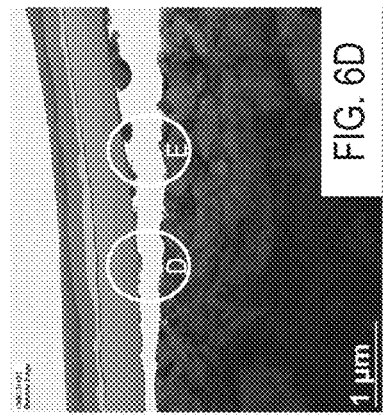

CORROSION RESISTANT FILM ON A
CHAMBER COMPONENT AND METHODS
OF DEPOSITING THEREOF

RELATED APPLICATIONS

This application claims priority to U.S. Non-provisional patent application Ser. No. 16/935,658, filed on Jul. 22, 2020, which claims priority to U.S. Provisional Patent Application No. 62/881,617, filed on Aug. 1, 2019 and to U.S. Provisional Patent Application No. 62/898,088, filed on Sep. 10, 2019, all of which are incorporated by reference in their entirety.

FIELD OF THE DISCLOSURE

Embodiments of the present disclosure relate generally to a corrosion resistant film on a chamber component and methods for depositing thereof.

BACKGROUND OF THE DISCLOSURE

Various manufacturing processes expose semiconductor process chamber components to high temperatures, high energy plasma, a mixture of corrosive gases, high stress, and combinations thereof. These extreme conditions may erode and/or corrode the chamber components, increasing the chamber components' susceptibility to defects. It may be advantageous to reduce these defects and improve the components' erosion and/or corrosion resistance in such extreme environments.

SUMMARY OF THE DISCLOSURE

In certain embodiments, the instant disclosure may be directed to a method for depositing a corrosion resistant film on a metal surface of a chamber component. The method may comprise performing x cycles to reduce a metal oxide on the metal surface of the chamber component. The method may further comprise performing y atomic layer deposition (ALD) cycles to form a corrosion resistant film onto the metal surface. In certain embodiments, x and y may be independent integers.

In other embodiments, the instant disclosure may be directed to a coated chamber component. The coated chamber component may comprise a body. The body may have a reduced metal surface. The reduced metal surface may comprise less metal oxide as compared to the amount of metal oxide on the metal surface before it has been reduced. A corrosion resistant film, coated on at least a portion of the reduced metal surface, may be conformal.

In a further embodiment, the instant disclosure may be directed to a method for depositing a corrosion resistant film on a nickel surface of a chamber component. The method may comprise performing x cycles to reduce a nickel oxide content on the nickel surface of the chamber component. The method may further comprise performing y atomic layer deposition (ALD) cycles to form a corrosion resistant film on the reduced nickel surface.

BRIEF DESCRIPTION OF THE DRAWINGS

The present disclosure is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one.

FIG. 6A depicts a SEM image, at 50 μm scale, of a nickel surface treated with ozone and coated with alumina after having been subjected to thermal cycling.

FIG. 6B depicts a blown up TEM cross-section image, at 0.5 μm scale, of section A in the TEM image of FIG. 6A.

FIG. 6C depicts a blown up SEM cross-section image, at 20 μm scale, of section B in the TEM image of FIG. 6A.

FIG. 6D depicts a blown up TEM cross-section image, at 1 μm scale, of the TEM image of FIG. 6C.

FIG. 6E depicts a blown up TEM cross-section image, at 100 nm scale, of section D in the TEM image of FIG. 6D.

FIG. 6F depicts a blown up TEM cross-section image, at 100 nm scale, of section E in the TEM image of FIG. 6D.

DETAILED DESCRIPTION

Figure 1:
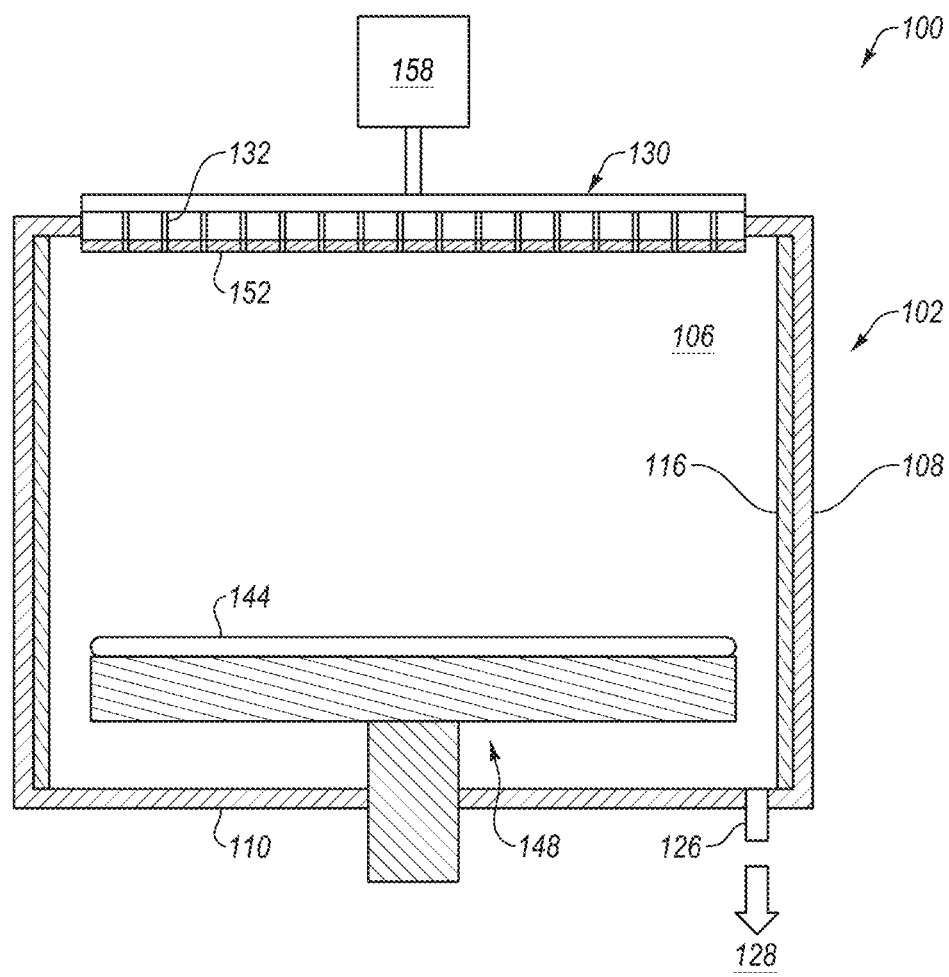
FIG. 1 depicts a cross sectional view of a processing chamber.

Embodiments described herein are directed to coated chamber components and methods for depositing a corrosion resistant film on a chamber component. The metal surface of the chamber component may have a naturally occurring native metal oxide thereon. The amount of the base metal oxide may be further enhanced by processes such as ozone pre-treatment which is often recommended in order to remove surface carbons and/or oils that were not fully removed during pre-cleaning of the surface. Wet ALD processes that utilize oxidative reactants such as water, oxygen, and/or ozone may also further oxidize the metal surface and may enhance the amount of base metal oxide on the metal surface even further. The interface between the base metal oxide and the metal surface may be susceptible to void formation. Such void formation at the interface affects adhesion of coatings (e.g., corrosion resistant film) to the metal surface and may result in decay, pin-hole formation, cracking, and delamination of the coating upon thermal cycling. This may lead to high failure rate of the corrosion resistant film resulting in frequent chamber component maintenance and increased recoating frequency. The void formation may occur due to incompatibilities in the coefficient of thermal expansion between the base metal oxide and the metal surface and/or due to the weak structure of the base metal oxide and/or due to stress exerted on the base metal oxide by the corrosion resistant film coated thereon.

The corrosion resistant film deposition methods described herein improve the interface between the corrosion resistant film and the surface of the chamber component that is being coated by reducing the base metal oxide on the metal surface in-situ, in some cases leaving a pristine metal surface. The reduced amount of base metal oxide on the metal surface may be further maintained by depositing the corrosion resistant film with a "dry ALD process" that uses alcohol as an oxidative reactant instead of water, oxygen, or ozone. Reducing or removing the amount of base metal oxide on the metal surface enhances the bonding strength of the metal surface of the chamber component to the corrosion resistant film deposited thereon. The dry ALD process minimizes re-oxidation of the metal surface of the chamber component that is to be coated with a corrosion resistant film.

The coated chamber components produced by the corrosion resistant film deposition methods described herein may beneficially exhibit improved corrosion resistant film adhesion to the chamber component, improved chamber component performance, reduced chamber component maintenance frequency, reduced stress related cracking and corrosion, and improved thermal cycling performance.

As used herein, the singular forms "a," "an," and "the" include plural references unless the context clearly indicates otherwise. Thus, for example, reference to "a precursor" includes a single precursor as well as a mixture of two or more precursors; and reference to a "reactant" includes a single reactant as well as a mixture of two or more reactants, and the like.

As used herein, the term "about" in connection with a measured quantity, refers to the normal variations in that measured quantity, as expected by one of ordinary skill in the art in making the measurement and exercising a level of care of one skilled in the art and the precision of the measuring equipment. In certain embodiments, the term "about" includes the recited number ±10%, such that "about 10" would include from 9 to 11.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to illuminate certain materials and methods and does not pose a limitation on scope. No language in the specification should be construed as indicating any non-claimed element as essential to the practice of the disclosed materials and methods.

FIG. 1 is a sectional view of a processing chamber 100 (e.g., a semiconductor processing chamber) having one or more chamber components that include a corrosion resistant film in accordance with embodiments. The processing chamber 100 may be used for processes in which a corrosive plasma environment is provided. For example, the processing chamber 100 may be a chamber for a plasma etch reactor (also known as a plasma etcher), a plasma cleaner, and so forth. Examples of chamber components that may include a corrosion resistant film are a substrate support assembly 148, an electrostatic chuck (ESC), a ring (e.g., a process kit ring or single ring), a chamber wall, a base, a showerhead 130, a gas distribution plate, a face plate, a liner, a liner kit, a gas line, a shield, a plasma screen, a remote plasma source, a flow equalizer, a cooling base, a chamber viewport, a ceramic insulator, a quartz insulator, a chamber lid, a nozzle, and so on.

In one embodiment, the processing chamber 100 includes a chamber body 102 and a showerhead 130 that enclose an interior volume 106. The showerhead 130 may or may not include a gas distribution plate. For example, the showerhead may be a multi-piece showerhead that includes a showerhead base and a showerhead gas distribution plate bonded to the showerhead base. Alternatively, the showerhead 130 may be replaced by a lid and a nozzle in some embodiments, or by multiple pie shaped showerhead compartments and plasma generation units in other embodiments. The chamber body 102 may be fabricated from nickel, copper, cobalt, chromium, molybdenum, aluminum, stainless steel, ruthenium, tungsten, platinum, or other suitable material. The chamber body 102 generally includes sidewalls 108 and a bottom 110.

An outer liner 116 may be disposed adjacent the sidewalls 108 to protect the chamber body 102. The outer liner 116 may be a halogen-containing gas resistant material such as alumina or yttria. The outer liner 116 may also be coated with a corrosion resistant film, in accordance with an embodiment.

An exhaust port 126 may be defined in the chamber body 102, and may couple the interior volume 106 to a pump system 128. The pump system 128 may include one or more pumps and throttle valves utilized to evacuate and regulate the pressure of the interior volume 106 of the processing chamber 100.

The showerhead 130 may be supported on the sidewalls 108 of the chamber body 102 and/or on a top portion of the chamber body. The showerhead 130 (or lid) may be opened to allow access to the interior volume 106 of the processing chamber 100, and may provide a seal for the processing chamber 100 while closed. A gas panel 158 may be coupled to the processing chamber 100 to provide process and/or cleaning gases to the interior volume 106 through the showerhead 130 or lid and nozzle. Showerhead 130 may be used for processing chambers used for dielectric etch (etching of dielectric materials). The showerhead 130 includes multiple gas delivery holes 132 throughout the showerhead 130. The showerhead 130 may be made of nickel, copper, chromium, cobalt, molybdenum, stainless steel, ruthenium, tungsten, platinum, aluminum, anodized aluminum, an aluminum alloy (e.g., Al 6061), or an anodized aluminum alloy. In some embodiments, the showerhead includes a gas distribution plate (GDP) bonded to the showerhead. The GDP may be made of, for example, Si or SiC. The GDP may additionally include multiple holes that line up with the holes in the showerhead.

Examples of processing gases that may be used to process substrates in the processing chamber 100 include halogen-containing gases, such as $C_2F_6$, $SF_6$, $SiCl_4$, HBr, $NF_3$, $CF_4$, $CHF_3$, $CH_2F_3$, F, $Cl_2$, $CCl_4$, $BCl_3$ and $SiF_4$, among others, and other gases such as $O_2$, or $N_2O$. Examples of carrier gases include $N_2$, He, Ar, and other gases inert to process gases (e.g., non-reactive gases).

A substrate support assembly 148 is disposed in the interior volume 106 of the processing chamber 100 below the showerhead 130. The substrate support assembly 148 holds a substrate 144 (e.g., a wafer) during processing. The substrate support assembly 148 may include an electrostatic chuck that secures the substrate 144 during processing, a metal cooling plate bonded to the electrostatic chuck, and/or one or more additional components. An inner liner (not shown) may cover a periphery of the substrate support assembly 148. The inner liner may be a halogen-containing gas resistant material such as alumina or yttria. The inner liner may also be coated with a corrosion resistant film, in accordance with an embodiment.

Any of the showerhead 130 (or lid and/or nozzle), sidewalls 108, bottom 110, substrate support assembly 148, outer liner 116, inner liner (not shown), or other chamber component may include a corrosion resistant film, in accordance with embodiments. For example, as shown showerhead 130 includes a corrosion resistant film 152. The corrosion resistant film is described in more detail with reference to FIG. 2 and the method of coating an article, such as a chamber component, with the corrosion resistant film is described in more detail with reference to FIG. 3.

Figure 2:
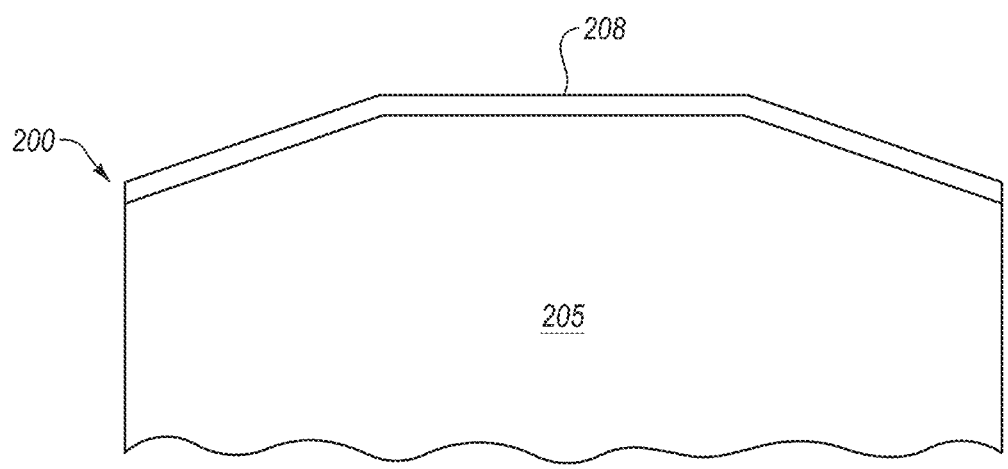
FIG. 2 depicts cross-sectional view of a coated chamber component according to an embodiment.

FIG. 2 is a sectional view of a coated chamber component 200, in accordance with an embodiment. In an embodiment, the coated chamber component may comprise a body 205 and a corrosion resistant film 208. The body 205 may have a reduced metal surface. A "reduced metal surface" refers a metal surface from which the base metal oxide associated with the metal that forms the surface has been reduced or removed, and in some instances may refer to a pristine surface (e.g., a surface with no native oxide). For example, the body may be made of nickel. A reduced nickel surface may refer to a pristine nickel surface from which nickel oxide and/or nickel hydroxide content has been reduced or removed.

In an embodiment, the reduced metal surface comprises less metal oxide as compared to a metal surface that has not been subjected to reduction. For instance, the reduced metal surface comprises about 20 wt % or less, about 15 wt % or less, about 10 wt % or less, about 8 wt % or less, about 5 wt % or less, about 3 wt % or less, or about 1 wt % or less of a metal oxide, based on total weight of the reduced metal surface. The term "metal oxide" also encompasses metal hydroxide and other metal compounds that include oxygen, with the metal portion of the term referring to the metal that forms the underlying metal surface.

In certain embodiments, the thickness of a metal oxide layer of a reduced metal surface may be smaller than the thickness of a metal oxide layer of a metal surface that has not been subjected to reduction. For instance, the thickness of a metal oxide layer of a reduced metal surface may be about 0.75 or less, about 0.7 or less, about 0.65 or less, about 0.6 or less, about 0.55 or less, about 0.5 or less, about 0.45 or less, about 0.4 or less, about 0.35 or less, about 0.3 or less, about or less, about 0.2 or less, about 0.15 or less, about 0.1 or less, or about 0.05 or less of the thickness of a metal oxide layer on a metal surface that has not been subjected to reduction. For example, if the thickness of a metal oxide layer on a metal surface that has not been subjected to reduction is 10 nm, and the thickness of a metal oxide layer of a reduced metal surface is 0.5 of the thickness of a metal oxide layer on a metal surface that has not been subjected to reduction, then the thickness of the metal oxide layer of a reduced metal surface is 5 nm (i.e., half of the thickness prior to reduction).

In an embodiment, the reduced metal surface may have substantially no oxidation. As used in this regard, "substantially no oxidation" means that the metal surface contains less than about 5 atom %, about 2 atom %, about 1 atom %, or about 0.5 atom % of oxygen based on a count of surface atoms.

In certain embodiments, the surface of the article to be coated may include a material such as silicon, silica, silicon nitride, doped silicon, germanium, gallium arsenide, glass, sapphire, metals, metal nitrides, metal alloys, and/or other conductive materials. In certain embodiments, the surface of the article may be a metal surface and may comprise at least one of nickel, copper, cobalt, chromium, molybdenum, stainless steel, ruthenium, tungsten, platinum, or a mixture thereof. The metal surface should not be construed as limited to this list. Other metal surfaces that may have a naturally occurring native metal oxide or that may readily form a metal oxide upon exposure to certain oxidants (e.g., ozone, water, oxygen) may be suitably used herein. In one embodiment, the metal surface may be nickel.

Exemplary base metal oxides may comprise at least one of nickel oxide, nickel hydroxide, copper oxide, copper hydroxide, cobalt oxide, cobalt hydroxide, chromium oxide, chromium hydroxide, molybdenum oxide, molybdenum hydroxide, ruthenium oxide, ruthenium hydroxide, tungsten oxide, tungsten hydroxide, platinum oxide, platinum hydroxide, or a mixture thereof. The metal oxides should not be limited to this list. Other base metal oxides that could be reduced with alcohol and/or carboxylic acid reductants (as described in further detail below) may be suitably used herein. In one embodiment, the metal oxide may be nickel oxide and/or nickel hydroxide.

The corrosion resistant film 208 may comprise at least one of aluminum oxide, yttrium oxide, zirconium oxide, $Y_3Al_5O_{12}$, a solid solution of $Y_2O_3$—$ZrO_2$, a compound comprising $Y_4Al_2O_9$ and a solid solution of $Y_2O_3$—$ZrO_2$, $HfO_2$, $HfAlO_x$, $HfZrO_x$, $HfYO_x$, Hf doped $Y_2O_3$, zinc oxide, tantalum oxide, titanium oxide, erbium oxide, gadolinium oxide, lanthanum oxide, praseodymium oxide, neodymium oxide, promethium oxide, samarium oxide, europium oxide, terbium oxide, dysprosium oxide, holmium oxide, thulium oxide, ytterbium oxide, or lutetium oxide.

The corrosion resistant film 208 may include $Y_2O_3$ and $Y_2O_3$ based ceramics, $Y_3Al_5O_{12}$ (YAG), $Al_2O_3$ (alumina), $Y_4Al_2O_9$ (YAM), $YF_3$, SiC (silicon carbide), $ErAlO_3$, $GdAlO_3$, $NdAlO_3$, $YAlO_3$, $Si_3N_4$ (silicon nitride), AlN (aluminum nitride), $TiO_2$ (titania), $ZrO_2$ (zirconia), TiC (titanium carbide), ZrC (zirconium carbide), TiN (titanium nitride), $Y_2O_3$ stabilized $ZrO_2$ (YSZ), $Er_2O_3$ and $Er_2O_3$ based ceramics, $Gd_2O_3$ and $Gd_2O_3$ based ceramics, $Er_3Al_5O_{12}$ (EAG), $Gd_3Al_5O_{12}$ (GAG), $Nd_2O_3$ and $Nd_2O_3$ based ceramics, a ceramic compound comprising $Y_4Al_2O_9$ and a solid-solution of $Y_2O_3$—$ZrO_2$, a ceramic compound comprising $Y_2O_3$, $Er_2O_3$, $ZrO_2$, $Gd_2O_3$ and $SiO_2$, Hf based oxides and solid solutions, lanthanide based oxides and solid solutions, or a combination of any of the above.

The corrosion resistant film may also be based on a solid solution formed by any of the aforementioned ceramics. The corrosion resistant film may also be a multiphase material that includes a solid solution of one or more of the aforementioned materials and one or more additional phase.

With reference to the solid-solution of $Y_2O_3$—$ZrO_2$, the corrosion resistant film may include $Y_2O_3$ at a concentration of 10-90 molar ratio (mol %) and $ZrO_2$ at a concentration of 10-90 mol %. In some examples, the solid-solution of $Y_2O_3$—$ZrO_2$ may include 10-20 mol % $Y_2O_3$ and 80-90 mol % $ZrO_2$, may include 20-30 mol % $Y_2O_3$ and 70-80 mol % $ZrO_2$, may include 30-40 mol % $Y_2O_3$ and 60-70 mol % $ZrO_2$, may include 40-50 mol % $Y_2O_3$ and 50-60 mol % $ZrO_2$, may include mol % $Y_2O_3$ and 30-40 mol % $ZrO_2$, may include 70-80 mol % $Y_2O_3$ and 20-30 mol % $ZrO_2$, may include 80-90 mol % $Y_2O_3$ and 10-20 mol % $ZrO_2$, and so on.

With reference to the corrosion resistant material comprising $Y_4Al_2O_9$ and a solid-solution of $Y_2O_3$—$ZrO_2$, in one embodiment the ceramic compound includes 62.93 molar ratio (mol %) $Y_2O_3$, 23.23 mol % $ZrO_2$ and 13.94 mol % $Al_2O_3$. In one embodiment, the ceramic compound includes about 77 mol % $Y_2O_3$, about 15 mol % $ZrO_2$, and about 8 mol % $Al_2O_3$. In another embodiment, the ceramic compound can include $Y_2O_3$ in a range of 50-75 mol %, $ZrO_2$ in a range of 10-30 mol % and $Al_2O_3$ in a range of 10-30 mol %. In another embodiment, the corrosion resistant material can include $Y_2O_3$ in a range of 40-100 mol %, $ZrO_2$ in a range of 0.1-60 mol % and $Al_2O_3$ in a range of 0.1-10 mol %. In another embodiment, the corrosion resistant material can include $Y_2O_3$ in a range of 40-60 mol %, $ZrO_2$ in a range of 35-50 mol % and $Al_2O_3$ in a range of 10-20 mol %. In another embodiment, the corrosion resistant material can include $Y_2O_3$ in a range of 40-50 mol %, $ZrO_2$ in a range of 20-40 mol % and $Al_2O_3$ in a range of 20-40 mol %. In another embodiment, the corrosion resistant material can include $Y_2O_3$ in a range of 80-90 mol %, $ZrO_2$ in a range of 0.1-20 mol % and $Al_2O_3$ in a range of 10-20 mol %. In another embodiment, the corrosion resistant material can include $Y_2O_3$ in a range of 60-80 mol %, $ZrO_2$ in a range of mol % and $Al_2O_3$ in a range of 20-40 mol %. In another embodiment, the corrosion resistant material can include $Y_2O_3$ in a range of 40-60 mol %, $ZrO_2$ in a range of 0.1-20 mol % and $Al_2O_3$ in a range of 30-40 mol %. In other embodiments, other distributions may also be used for the corrosion resistant material.

In one embodiment, the corrosion resistant material includes or consists of a ceramic compound that includes a combination of $Y_2O_3$, $ZrO_2$, $Er_2O_3$, $Gd_2O_3$ and $SiO_2$. In one embodiment, the corrosion resistant material can include $Y_2O_3$ in a range of 40-45 mol %, $ZrO_2$ in a range of 0-10 mol %, $Er_2O_3$ in a range of 35-40 mol %, $Gd_2O_3$ in a range of 5-10 mol % and $SiO_2$ in a range of 5-15 mol %. In a first example, the corrosion resistant material includes 40 mol % $Y_2O_3$, 5 mol % $ZrO_2$, 35 mol % $Er_2O_3$, 5 mol % $Gd_2O_3$ and 15 mol % $SiO_2$. In a second example, the corrosion resistant material includes 45 mol % $Y_2O_3$, 5 mol % $ZrO_2$, 35 mol % $Er_2O_3$, mol % $Gd_2O_3$ and 5 mol % $SiO_2$. In a third example, the corrosion resistant material includes mol % $Y_2O_3$, 5 mol % $ZrO_2$, 40 mol % $Er_2O_3$, 7 mol % $Gd_2O_3$ and 8 mol % $SiO_2$.

Any of the aforementioned corrosion resistant films may include trace amounts of other materials such as $ZrO_2$, $Al_2O_3$, $SiO_2$, $B_2O_3$, $Er_2O_3$, $Nd_2O_3$, $Nb_2O_5$, $CeO_2$, $Sm_2O_3$, $Yb_2O_3$, or other oxides. In one embodiment, the corrosion resistant film may be alumina.

The corrosion resistant film may be crystalline or amorphous and may conformally cover the reduced metal surface and features thereon with a substantially uniform thickness. In one embodiment, the plasma resistant coating has a conformal coverage of the underlying surface that is coated (including coated surface features) with a uniform thickness having a thickness variation of less than about +/−20%, a thickness variation of +/−10%, a thickness variation of +/−5%, or a lower thickness variation when comparing the thickness of the coating at one location to another location or according to the standard deviation of the average thickness of the coating from a plurality of locations. Since ALD is a very conformal process, the corrosion resistant film 208 may have a roughness that matches the underlying reduced metal surface roughness that is coated.

The corrosion resistant film 208 may be very dense and have a very low porosity as compared to other deposition techniques (such as e-beam IAD or plasma spray). For instance, the corrosion resistant film may have a porosity of less than about 1.5%, less than about 1%, less than about 0.5%, or about 0% (i.e., porosity free). The term "porosity-free" as used herein means absence of any pores, pin-holes, voids, or cracks along the whole depth of the corrosion resistant film as measured by transmission electron microscopy (TEM). In contrast, with conventional e-beam IAD or plasma spray techniques, cracks form upon deposition even at thicknesses of 5 or 10 μm and the porosity may be 1-5%.

The corrosion resistant film 208 may be adhered to the body 205 such that the interface between the corrosion resistant film and the body are substantially void free. For instance, at least about 50%, at least about 60%, at least about 70%, at least about 80%, at least about 90%, at least about 95%, at least about 98%, at least about 99%, at least about 99.5%, at least about 99.8%, or 100% of the body's surface area that could be exposed to corrosive plasma is adhered continuously to the corrosion resistant film. The term "adhered continuously" refers to a corrosion resistant film that is adhered to the body's surface without any gaps in the interface between the corrosion resistant film and the body's surface.

Exemplary coated chamber components that may be coated with the corrosion resistant films described herein may include a showerhead, a substrate support assembly, a chuck, a ring, a chamber wall, a base, a gas line, a gas distribution plate, a face plate, a nozzle, a lid, a liner, a liner kit, a shield, a plasma screen, a remote plasma source, a flow equalizer, a cooling base, a chamber viewport, ceramic insulators, quartz insulators, or a chamber lid.

In certain embodiments, the corrosion resistant film 208 of the coated chamber component maintains its integrity and physical properties after thermal cycling. For instance, the corrosion resistant film 208 may remain conformal and/or porosity free and/or adhered continuously and void free to the body 205, as described above, after thermal cycling. Exemplary thermal cycling may comprise subjecting the coated chamber component to a high temperature of about 550° C., followed by temperature reduction, and repetition thereof for a number of cycles that may range from about 1 to 10,000, from about 2 to 1,000, or from about 3 to 1,000.

In one embodiment, atomic layer deposition (ALD) may be utilized to deposit the corrosion resistant film 208 on the surface of the chamber component. An exemplary ALD process for depositing the corrosion resistant film is described in more detail in FIG. 3.

Figure 3:
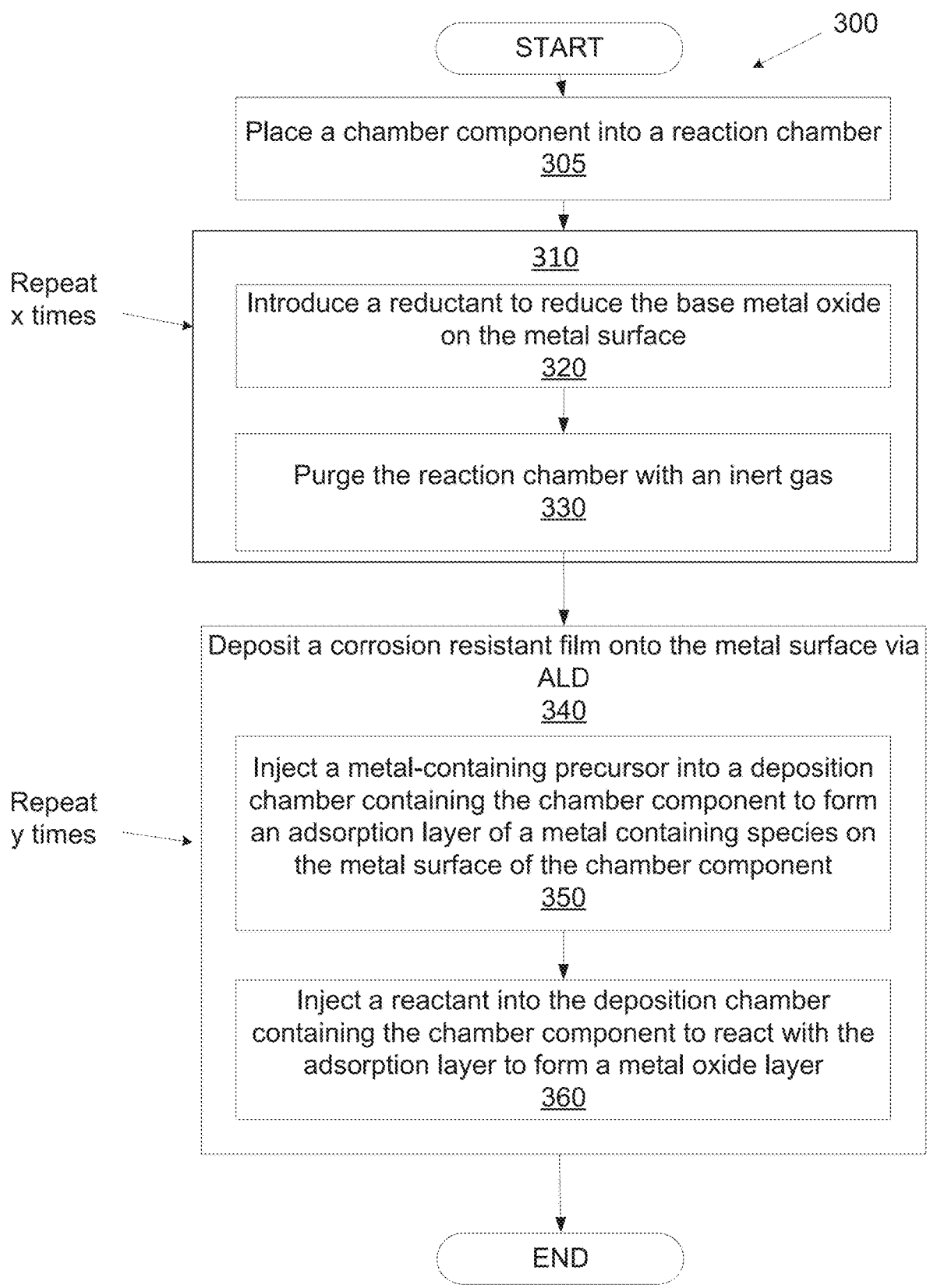
FIG. 3 depicts a method for depositing a corrosion resistant film on a chamber component according to an embodiment.

FIG. 3 is a flow chart showing a method 300 for depositing a corrosion resistant film onto a metal surface of an article, such as a chamber component, according to an embodiment. At block 305, the method comprises placing a chamber component into a deposition chamber suited for depositing a corrosion resistant film. The chamber component that is placed into the deposition chamber may have been cleaned and/or degreased. In certain embodiments, the cleaning and/or degreasing may be performed by a different party than the party depositing the corrosion resistant film onto the chamber component. In other embodiments, the same party may perform the cleaning and/or degreasing of the chamber component and the corrosion resistant film deposition. In certain embodiments, the cleaned and/or degreased chamber component is not pre-treated with ozone prior to deposition of the corrosion resistant film.

Thereafter, the pressure in the deposition chamber may be pumped down to reach a vacuum, inert gas (such as nitrogen or argon) may be introduced into the deposition chamber, and the deposition chamber may be heated to reach a deposition temperature (the deposition temperature may be optimized based on the precursors and/or reactants that are used). Subsequently, the method may comprise x metal surface reduction cycles followed by y ALD cycles.

The number of x and y cycles may be independent integers (such as, without limitations, 1, 2, 3, 4, 5, 10, 15, 20, 25, 30, 35, 40, 45, 50, 75, 100, 200, 300, 400, 500, any integer in between, and so on). For instance, x may range from about 5 to about 100, from about 10 to about 80, from about 15 to about 60, or from about 20 to about 40 and y may range from about 100 to about 10,000, from about 1,000 to about 5,000, or from about 2,000 to about 4,000.

At block 310, the method comprises an exemplary pulse/purge reduction sequence for reducing a metal oxide on the metal surface of the chamber component. An exemplary pulse/purge reduction sequence may comprise introducing (e.g., by pulsing) an alcohol and/or a carboxylic acid and/or aldehyde and/or hydrogen reductant into the reaction chamber for a first duration, in accordance with block 320, to reduce the base metal oxide on the metal surface. The first duration may range from about 0.05 seconds to about 5 seconds, from about 0.1 seconds to about 1 seconds, or from about 0.2 seconds to about 0.5 seconds. The exemplary pulse/purge reduction sequence may further comprise purging the deposition chamber with an inert gas (such as nitrogen, argon, helium, or neon) for a second duration, in accordance with block 330. The second duration may range from about 5 seconds to about 60 seconds, from about 10 seconds to about 50 seconds, or from about 20 seconds to about 40 seconds. This reduction sequence may be performed x times to reduce or remove in-situ the metal oxide of the metal surface. The first duration of the alcohol and/or carboxylic acid and/or aldehyde and/or hydrogen reductant pulsing and the second duration of the inert gas purging may be adjusted based on the size and type of chamber component (and correspondingly the surface area that is being reduced).

Reducing the metal oxide on the metal surface may consume from about 0.001 g/s–m$^2$ to about 0.015 g/s–m$^2$, from about 0.002 g/s–m$^2$ to about 0.014 g/s–m$^2$, from about 0.003 g/s–m$^2$ to about 0.013 g/s–m$^2$, from about 0.004 g/s–m$^2$ to about 0.012 g/s–m$^2$, or from about 0.005 g/s–m$^2$ to about 0.010 g/s–m$^2$ alcohol and/or carboxylic acid and/or aldehyde and/or hydrogen reductant per second per area of the metal surface.

Suitable alcohol reductants that may be used to reduce the metal oxide of the metal surface may have a vapor pressure (Vp) that is greater than about 0.5 Torr at about 200° C. In certain embodiments, suitable alcohol reductants may have general formula I:

Formula I

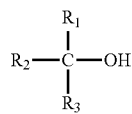

where $R_1$, $R_2$, and $R_3$ may be an organic substituent that is independently a hydrogen, alkyl, alkene, alkyne, cyclo, aryl, linear or branched. In certain embodiments, the organic substituent may contain atoms other than carbon. In certain embodiments, the reductant alcohols may contain more than one hydroxyl group.

In one embodiment, the reductant alcohol may include at least one of

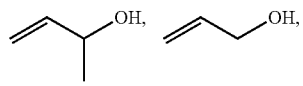

ethanol, methanol, isopropanol, t-butanol, and mixtures thereof. Other alcohol reductant that may reduce metal oxides on the metal surface may be suitably used herein.

Suitable aldehyde reductants that may be used to reduce the metal oxide of the metal surface may have a general formula II:

Formula II

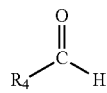

where $R_4$ may be an organic substituent that is a methyl, ethyl, $C_{3+}$ alkyl, alkene, alkyne, cyclo, aryl, linear or branched. In certain embodiments, the organic substituent may contain atoms other than carbon. In certain embodiments, the reductant aldehyde may contain more than one carbonyl group.

In one embodiment, the reductant aldehyde may include at least one of

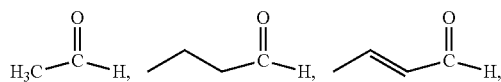

and mixtures thereof. Other aldehyde reductants that may reduce metal oxides on the metal surface may be suitably used herein.

Suitable carboxylic acid reductants that may be used to reduce the metal oxide of the metal surface may have general formula III:

Formula III

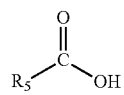

where $R_5$ may be an organic substituent that is a hydrogen, methyl, ethyl, $C_{3+}$ alkyl, alkene, alkyne, cyclo, or aryl, linear or branched. In certain embodiments, the organic substituent may contain atoms other than carbon. In certain embodiments, the reductant carboxylic acid may contain more than one carboxyl group.

In one embodiment, the reductant carboxylic acid may include at least one of

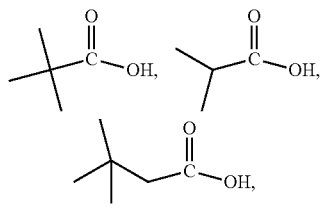

formic acid, and mixtures thereof. Other carboxylic acid reductants that may reduce metal oxides on the metal surface may be suitably used herein.

For the purpose of the present disclosure, the term "alkyl" as used by itself or as part of another group refers to a straight- or branched-chain aliphatic hydrocarbon containing one to twelve carbon atoms (i.e., $C_{1-12}$ alkyl) or the number of carbon atoms designated (i.e., a $C_1$ alkyl such as methyl, a $C_2$ alkyl such as ethyl, a $C_3$ alkyl such as propyl or isopropyl, etc.). The term "alkyl" may encompass in certain embodiments an optionally substituted alkyl with an atom or a group other than carbon.

For the purpose of the present disclosure, the term "alkene" as used by itself or as part of another group refers to a straight- or branched-chain unsaturated hydrocarbon containing at least one carbon-carbon double bond and containing one to twelve carbon atoms (i.e., $C_{2-12}$ alkene) or the number of carbon atoms designated (i.e., a $C_2$ alkyl such as ethene, a $C_3$ alkyl such as propene, etc.). The term "alkene" may encompass in certain embodiments an optionally substituted alkene with an atom or a group other than carbon.

For the purpose of the present disclosure, the term "alkyne" as used by itself or as part of another group refers to a straight- or branched-chain unsaturated hydrocarbon containing at least one carbon-carbon triple bond and containing one to twelve carbon atoms (i.e., $C_{2-12}$ alkyne) or the number of carbon atoms designated (i.e., a $C_3$ alkyl such as propyne, etc.). The term "alkyne" may encompass in certain embodiments an optionally substituted alkyne with an atom or a group other than carbon.

For the purpose of the present disclosure, the term "cyclo" as used by itself or as part of another group refers to hydrocarbons containing at least one ring. The term "cyclo" may encompass in certain embodiments an optionally substituted cyclo with an atom or a group other than carbon.

For the purpose of the present disclosure, the term "aryl" as used by itself or as part of another group refers to hydrocarbons containing at least one aromatic ring (e.g., phenyl or naphthyl). The term "aryl" may encompass in certain embodiments an optionally substituted aryl with an atom or a group other than carbon.

Referring back to FIG. 3, at block 340, the method may comprise depositing a corrosion resistant film after the metal oxide of the metal surface has been reduced. The corrosion resistant film may be deposited onto the reduced metal surface by ALD.

Various types of ALD processes exist and the specific type may be selected based on several factors such as the surface to be coated, the coating material, chemical interaction between the surface and the coating material, etc. The general principle of an ALD process comprises growing or depositing a thin film layer by repeatedly exposing the surface to be coated to sequential alternating pulses of gaseous chemical precursors that chemically react with the surface one at a time in a self-limiting manner.

An exemplary ALD cycle from the y ALD cycles may comprise forming a first adsorption layer of a metal containing species onto the reduced metal surface of the chamber component by injecting a metal-containing precursor into a deposition chamber containing the chamber component, in accordance with block 350. The exemplary ALD cycle may further comprise injecting a reactant into the deposition chamber containing the chamber component to react with the adsorption layer to form a metal oxide layer, in accordance with block 360. In one embodiment, the reactant is an alcohol-based reactant. The ALD sequence may be performed y times until a certain thickness for the corrosion resistant film is reached.

The durations of each pulse/dose/injection of a metal-containing precursor or an alcohol-based reactant may be variable and may be adjusted to accommodate, for example, the volume capacity of the processing chamber as well as the capabilities of a vacuum system coupled thereto. The injection time of a precursor or a reactant may vary according to its flow rate, its temperature, the type of control valve, the type of process chamber employed, as well as the ability of the components to adsorb onto the underlying surface. Injection times may also vary based upon the type of layer being formed and the geometry of the underlying article being coated. The injection time should be long enough to provide a volume of precursor and/or reactant sufficient to adsorb/chemisorb onto substantially the entire underlying surface and form a metal oxide layer thereon.

In certain embodiments, the injection time of the alcohol reactant and/or the metal containing precursor may range from about 0.1 seconds to about 90 seconds, from about 0.5 seconds to about 60 seconds, from about 1 second to about 30 seconds, from about 2 seconds to about 25 seconds, from about 3 seconds to about 20 seconds, from about 4 seconds to about 15 seconds, or from about 5 seconds to about 10 seconds.

The processing chamber pressure during the corrosion resistant film deposition by ALD may be in the range of about 50 mTorr to about 750 Torr, about 100 mTorr to about 400 Torr, or about 1 Torr to about 100 Torr.

In certain embodiments, a cycle of metal-containing precursor injection may be followed by a purge cycle where an inert gas (such as argon, nitrogen, helium, neon, or the like) may be injected to the processing chamber to remove excess reagent (e.g., unreacted metal-containing precursor) out of the chamber before injecting an alcohol reactant. Similarly, in certain embodiments, a cycle of alcohol reactant injection may be followed by a purge cycle with an inert gas to remove excess reagent (e.g., unreacted alcohol reactant) out of the processing chamber. The inert gas may be injected at a flow ranging from about 1 to about 10000 sccm.

Each film layer (individually as well as cumulatively the y film layers together arising from y ALD cycles) deposited by ALD may be uniform, continuous and conformal. The film layer(s) may also be very dense and have a very low porosity of less than 1% in embodiments, less than 0.1% in some embodiments, or approximately 0% in further embodiments.

Various metal-containing precursors may be used in the ALD cycles, such as, without limitations, aluminum-containing precursors, yttrium-containing precursors, zirconium-containing precursors, hafnium-containing precursors and the like.

Exemplary aluminum-containing precursors may include, without limitations, trimethylaluminum (TMA), diethylaluminum ethoxide, tris(ethylmethylamido)aluminum, aluminum sec-butoxide, aluminum tribromide, aluminum trichloride, triethylaluminum (TEA), triisobutylaluminum, trimethylaluminum, or tris(diethylamido)aluminum. In one embodiment, the aluminum precursor used may be TMA.

Exemplary yttrium-containing precursors may include, without limitations, tris(N,N-bis(trim ethyl silyl)amide)yttrium (III), yttrium (III)butoxide, tris(cyclopentadienyl)yttrium(III), and Y(thd)3 (thd=2,2,6,6-tetramethyl-3,5-heptanedionato).

Exemplary zirconium-containing precursors may include, without limitations, zirconium (IV) bromide, zirconium (IV) chloride, zirconium (IV) tert-butoxide, tetrakis(diethylamido)zirconium (IV), tetrakis(dimethylamido)zirconium (IV), or tetrakis(ethylmethylamido)zirconium (IV).

Exemplary hafnium-containing precursors may include, without limitations, $HfCl_4$, TEMAHf, TDMAHf, HfCp variants, ZrCp variants.

Exemplary reactants that may be used to oxidize the reaction product of the metal-containing precursors with the metal surface and form the corrosion resistant metal oxide film may include at least one of an alcohol reactant, oxygen, ozone, water, or a mixture thereof. In one embodiment, referred to as a "dry ALD process," the reactant may be an alcohol reactant and no "wet" reactants, such as water, may be used in the ALD process in embodiments. In certain embodiments, "dry" reactants may be used in the "dry ALD process" to deposit a metal oxide coat on a metal surface of an article with substantially no oxidation of the underlying metal surface of the article.

Suitable alcohol reactants may have general formula R—OH, where R is any suitable organic substituent. In certain embodiments, the alcohol reactant may contain 1, 2, 3, 4, 5, 6, 7, 8, 9, or 10 carbon atoms. In certain embodiments, the organic substituent may be one or more of alkyl, alkenyl, alkynyl, cyclo, aryl, linear or branched. In certain embodiments, the organic substituent may contain atoms other than carbon. In certain embodiments, the alcohol reactant may contain more than one hydroxyl group. In some embodiments, the alcohol reactant consists essentially of methanol. In some embodiments, the alcohol reactant consists essentially of ethanol. In some embodiments, the alcohol reactant consists essentially of isopropanol. In some embodiments, the alcohol reactant consists essentially of t-butanol. As used in this regard, an alcohol reactant "consists essentially of" a stated alcohol if the alcohol is greater than 95%, 98%, 99% or 99.5% of the stated alcohol on a molar basis.

Suitable alcohol reactants may include, without limitations, methanol, ethanol, isopropanol, t-butanol, 3-methyl-t-butanol, 3-butene-2-ol, 2-methyl-3-butene-2-ol, 1-chloro-2-propanol, 1,1,1-trifluoro-2-propanol, 2-methoxyethanol, 2-phenyl-2-propanol, or a mixture thereof. In certain embodiments the alcohol reactant used in a dry ALD process may be the same as the alcohol reductant used during in-situ reduction of base metal oxide on the metal surface of the chamber component. In other embodiments, the alcohol reactant used in a dry ALD process may be different from the alcohol reductant used during in-situ reduction of base metal oxide on the metal surface of the chamber component.

The alcohol reactants may be provided in one or more pulses or continuously. The flow rate of the reactants can be any suitable flow rate including, but not limited to, flow rates in the range of about 1 to about 5000 sccm, about 2 to about 4000 sccm, about 3 to about 3000 sccm, or about 5 to about 2000 sccm. The reactants may be provided at any suitable pressure including, but not limited to, a pressure in the range of about 5 mTorr to about 25 Torr, about 100 mTorr to about Torr, about 5 Torr to about 20 Torr, about 50 mTorr to about 2000 mTorr, about 100 mTorr to about 1000 mTorr, or about 200 mTorr to about 500 mTorr.

ALD processes may be conducted at various temperatures. The optimal temperature range for a particular ALD process is referred to as the "ALD temperature window." Temperatures below the ALD temperature window may result in poor growth rates and non-ALD type deposition. Temperatures above the ALD temperature window may result in thermal decomposition of the article or rapid desorption of the precursor. The ALD temperature window may range from about 200° C. to about 500° C. In some embodiments, the ALD temperature window is between about 250° C. to about 450° C. In an embodiment, the ALD temperature window is between 300° C. to about 400° C.

In some embodiments, the article that is being coated may be maintained at a temperature greater than or equal to about 25° C., about 50° C., about 100° C., about 150° C., about 200° C., about 250° C., about 300° C., about 350° C., about 400° C., about 450° C., or about 500° C. In some embodiments, the article that is being coated may be maintained at a temperature less than or equal to about 600° C., about 550° C., about 500° C., about 450° C., about 400° C., about 350° C., about 300° C., about 250° C., about 200° C., about 150° C., about 100° C., about 50° C., or about 25° C.

The ALD sequence described above may refer to a sequential deposition sequence. A sequential ALD sequence may be such that prior to introduction of a new precursor(s) and/or a new reactant(s), the chamber in which the ALD process takes place is purged with an inert carrier gas (such as nitrogen or argon) to remove any unreacted precursors and/or reactants and/or surface-precursor reaction byproducts. Other ALD sequences may also be suitable in this disclosure, such as, without limitations, a co-dosing and a co-deposition sequences.

Suitable corrosion resistant films may comprise, without limitations, mono-layer coatings, bi-layer coatings, multi-layer coatings of the same or different materials in various arrangement (e.g., alternating layers of two metal oxide layers).

Suitable thickness for the corrosion resistant film may range from about 1 nm to 1000 μm. In embodiments, the corrosion resistant film may have a maximum thickness of about 750 μm, a maximum thickness of about 500 μm, a maximum thickness of about 400 μm, a maximum thickness of about 300 μm, a maximum thickness of about 250 μm, a maximum thickness of about 200 μm, a maximum thickness of about 150 μm, a maximum thickness of about 100 μm, a maximum thickness of 50 μm, a maximum thickness of 30 μm, a maximum thickness of 10 μm, a maximum thickness of 1 μm or another maximum thickness. In embodiments, the corrosion resistant film may have a minimum thickness of 5 nm, a minimum thickness of 10 nm, a minimum thickness of 15 nm, a minimum thickness of 25 nm, a minimum thickness of 35 nm, a minimum thickness of 50 nm, a minimum thickness of 100 nm, a minimum thickness of 150 nm, or another minimum thickness.

In certain embodiments, the thickness of the base metal oxide coat, after the x reduction cycles and/or after deposition of the corrosion resistant film (via wet ALD or via dry ALD) and/or after thermal cycling of the coated chamber component, is less than about 20 nm, less than about 15 nm, less than about 10 nm, less than about 5 nm, less than about 3 nm, less than about 1 nm, or is missing altogether.

In certain embodiments, the ratio of the thickness of the corrosion resistant film to the thickness of the native metal oxide coat (if any is remaining), after the x reduction cycles and/or after deposition of the corrosion resistant film (via wet ALD or via dry ALD) and/or after thermal cycling of the coated chamber component, ranges from about 10,000:1 to about 5:1, from about 1,000:1 to about 10:1, from about 500:1 to about 20:1, with the thickness of the corrosion resistant film being greater than the thickness of the base metal oxide coat.

The ALD process allows for conformal film layers having uniform film thickness on articles and surfaces having complex geometric shapes, holes with large aspect ratios, and three-dimensional structures. Sufficient exposure time of the precursors to the surface enables the precursors to disperse and fully react with the surface in its entirety, including all of its three-dimensional complex features. The exposure time utilized to obtain conformal ALD in high aspect ratio structures is proportionate to the square of the aspect ratio and can be predicted using modeling techniques.

Figure 4:
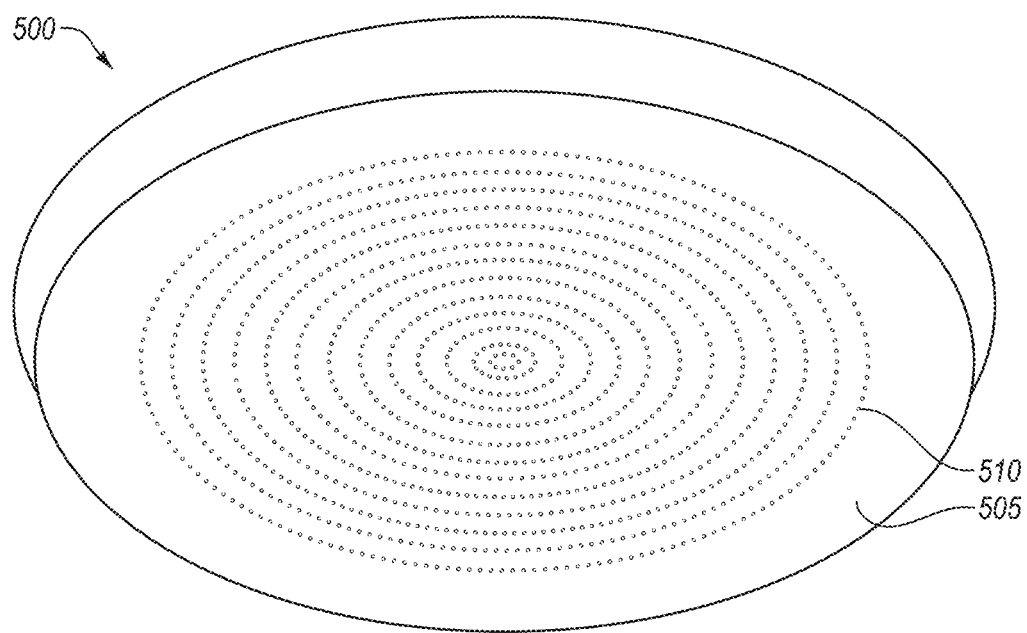
FIG. 4 depicts a bottom view of a showerhead that may be coated with a corrosion resistant film according to an embodiment.

FIG. 4 illustrates a bottom view of a showerhead 500. The showerhead example provided below is just an exemplary chamber component whose performance may be improved by elimination of ozone pre-treatment and/or reduction of the metal oxide on the metal surface and/or deposition of the corrosion resistant film described herein. It is to be understood that the performance of other chamber components may also be improved when the amount of native metal oxide is reduced on the metal surface prior to it being coated with the corrosion resistant film disclosed herein. The showerhead 500, as depicted here, was chosen as an illustration of a chamber component having a metal surface with complex geometry and holes with large aspect ratios.

The complex geometry of lower surface 505 is configured to receive a corrosion resistant film. Lower surface 505 of showerhead 500 defines gas conduits 510 arranged in evenly distributed concentric rings. In other embodiments, gas conduits 510 may be configured in alternative geometric configurations and may have as many or as few gas conduits as needed depending on the type of reactor and/or process utilized. Surface 505 may be a metal surface such as nickel, copper, chromium, cobalt, molybdenum, tungsten, platinum, ruthenium, or stainless steel. In an embodiment, metal surface 505 comprises nickel. The metal oxide (e.g., nickel oxide and/or nickel hydroxide) on surface 505 may be reduced. A corrosion resistant film (e.g., alumina) may be deposited, using an ALD technique which enables a conformal coating of relatively uniform thickness, on the reduced metal surface 505 as well as on the reduced metal surface in gas conduit holes 510, despite the complex geometry and the large aspect ratios of the holes. Uniform thickness refers to a corrosion resistant film having a thickness variation of less than about +/−20%, a thickness variation of +/−10%, a thickness variation of +/−5%, or a lower thickness variation when comparing the thickness of the corrosion resistant film at one location to its thickness at another location on the film or when assessing the standard deviation achieved from the average of a plurality of thickness values from a plurality of locations on the film.

Showerhead 500 may be exposed to corrosive chemistries such as fluorine and may erode due to plasma interaction with the showerhead. The elimination of ozone pre-treatment and/or reduction cycles and/or dry ALD deposition of the corrosion resistant film may reduce such plasma interactions and improve the showerhead's durability. The corrosion resistant film deposited with ALD maintains the relative shape and geometric configuration of the lower surface 505 and of the gas conduits 510 so as to not disturb the functionality of the showerhead. Similarly, when applied to other chamber components, the corrosion resistant film may maintain the shape and geometric configuration of the surface it coats so as to not disturb the component's functionality, provide plasma resistance, and improve corrosion resistance throughout the entire surface.

The resistance of the corrosion resistant film to plasma is measured through "etch rate" (ER), which may have units of Angstrom/min (A/min), throughout the duration of the coated components' operation and exposure to plasma. Plasma resistance may also be measured through an erosion rate having the units of nanometer/radio frequency hour (nm/RFHr), where one RFHr represents one hour of processing in plasma processing conditions. Measurements may be taken after different processing times. For example, measurements may be taken before processing, after 50 processing hours, after 150 processing hours, after 200 processing hours, and so on. An erosion rate lower than about 100 nm/RFHr, in halogen plasma, is typical for a corrosion resistant film. Variations in the composition of the corrosion resistant film deposited on the showerhead or on any other chamber components may result in multiple different plasma resistances or erosion rate values. Additionally, a corrosion resistant film with a single composition exposed to various plasmas could have multiple different plasma resistances or erosion rate values. For example, a corrosion resistant film may have a first plasma resistance or erosion rate associated with a first type of plasma and a second plasma resistance or erosion rate associated with a second type of plasma.

Figure 5:
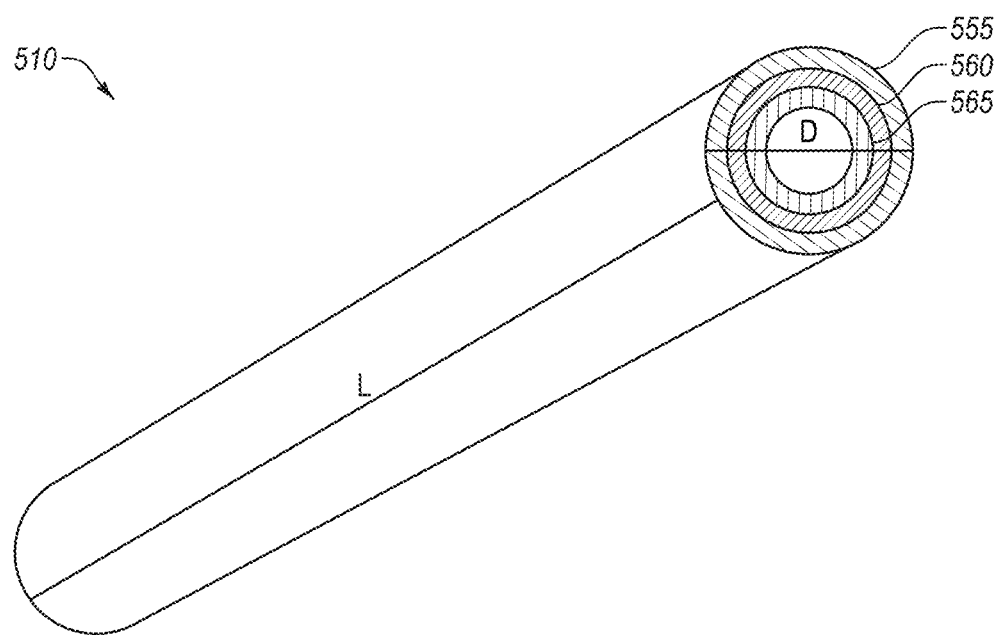
FIG. 5 depicts a blown up view of a gas conduit having a large aspect ratio coated with a corrosion resistant film according to an embodiment.

FIG. 5 depicts a blown up view of a gas conduit 510 having a large aspect ratio coated according to an embodiment. Gas conduit 510 may have a length L and a diameter D. Gas conduit 510 may have a large aspect ratio defined as L:D, wherein the aspect ratio may range from about to about 100:1. In some embodiments, the aspect ratio may be lower than 50:1 (e.g., about or greater than 100:1 (e.g., about 300:1).

Gas conduit 510 may have an interior metal surface 555. Interior metal surface 555 (made of nickel for example) may have its base metal oxide (e.g., nickel oxide and/or nickel hydroxide) reduced as described with respect to blocks 310, 320, and 330 in FIG. 3. Thereafter, interior metal surface 555 may be coated with a corrosion resistant film using ALD (e.g., dry ALD) as described with respect to blocks 340, 350, and 360 in FIG. 3. The ALD process may grow conformal and uniform coating layers of uniform thickness throughout the interior surface of gas conduit 510 despite its large aspect ratio while ensuring that the final corrosion resistant film may also be thin enough so as to not plug the gas conduits in the showerhead.

In certain embodiments, eliminating ozone pre-treatment and/or reducing the base metal oxide on a metal surface of a chamber component prior to deposition of the corrosion resistant film and/or depositing the corrosion resistant film via a dry ALD process has one or more advantages, such as, improved adhesion between the metal surface and the corrosion resistant film immediately after coating, improved chamber component performance, reduced preventative maintenance frequency, reduced stress corrosion cracking, and/or improved thermal cycling performance. These improved properties may be illustrated with reference to FIGS. 6A through 6F and FIGS. 7A through 7B.

FIG. 6A depicts a SEM image, at 50 μm scale, of a nickel surface treated with ozone, in accordance with a conventional best known method, and coated with alumina after having been subjected to thermal cycling. The nickel oxide coat formed on the nickel surface after ozone treatment is believed to have led to buckling and delamination of the alumina film after thermal cycling. This is believed to occur due to the weak structure of nickel oxide due to, at least in part, the existence of different nickel oxide grain structures which inhibit its ability to form a dense structure. The buckling and delamination may also occur due to incompatibilities in the coefficient of thermal expansion between the nickel and nickel oxide causing the two materials to expand at different rates. Another factor that may contribute to buckling and delamination may be the stress exerted on the weak nickel oxide layer by the corrosion resistant film.

Section A shown in FIG. 6A is a depiction of an area where bubbling and delamination is not observed. Section B shown in FIG. 6A is a depiction of an area where bubbling of the alumina coat is observed. Sections C shown in FIG. 6A is a depiction of an exposed nickel surface where the alumina coat has already fallen off after thermal cycling. The skilled artisan will appreciate that delamination of the corrosion resistant film may cause particle generation and expose the chamber component to a corrosive environment which would reduce the lifetime of the chamber component. A blown up cross sectional view of sections A and B are further shown in FIGS. 6B and 6C, respectively.

FIG. 6B depicts a blown up TEM image, at 0.5 μm scale, of the cross-section view of section A in the TEM image of FIG. 6A. At the view of FIG. 6A, the alumina coat appears to maintain its integrity and adhesion to the nickel surface. However, in FIG. 6B, voids 610 in the interface between the alumina coat and the nickel surface become apparent. Voids 610 form a weak point in the adhesion between alumina coat and the nickel surface which could weaken even further upon additional thermal cycling. Additional thermal cycling could increase void 610 further, leading to bubbling of the alumina coat in that section, and ultimately to that section of the coat falling off completely and leaving the nickel surface exposed (as illustrated by sections C in FIG. 6A).

FIG. 6C depicts a blown up SEM image, at 20 μm scale, of the cross-section view of section B in the TEM image of FIG. 6A. At the view of FIG. 6C, the delamination of section B becomes apparent. FIG. 6D depicts a blown up TEM image, at 1 μm scale, of the TEM image of FIG. 6C. FIG. 6E depicts a blown up TEM cross-section image, at 100 nm scale, of section D in the TEM image of FIG. 6D. FIG. 6F depicts a blown up TEM cross-section image, at 100 nm scale, of section E in the TEM image of FIG. 6D. The blown up views seen in FIGS. 6D-6F illustrate that the delamination occurs at the interface between the nickel surface and the nickel oxide rather than between the nickel oxide and the alumina, as evidenced by the remains of nickel oxide 620 attached to the alumina layer 630.

Figure 7A:
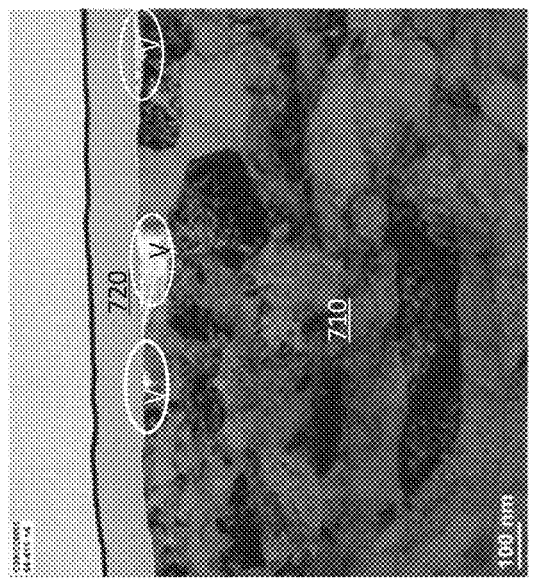
FIG. 7A depicts a TEM cross-section image, at 100 nm scale, of a nickel surface coated with alumina, without ozone treatment, prior to thermal cycling.
Figure 7B:
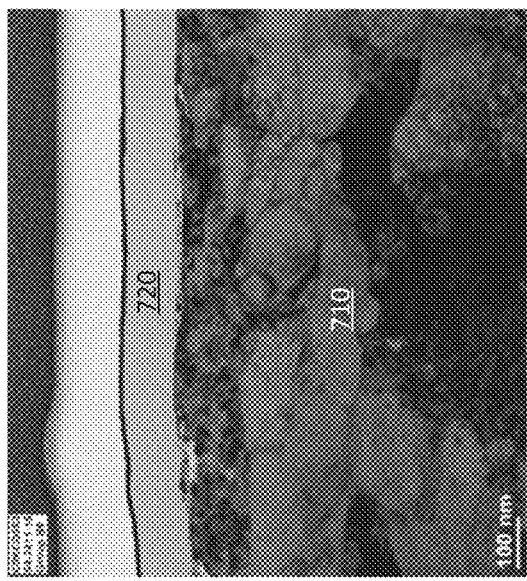
FIG. 7B depicts a TEM cross-section image, at 100 nm scale, of the sample of FIG. 7A after thermal cycling.

FIG. 7A depicts a TEM image, at 100 nm scale, of a cross-sectional view of a nickel surface coated with alumina, without ozone treatment, prior to thermal cycling. FIG. 7B depicts a TEM image, at 100 nm scale, of the sample of FIG. 7A after thermal cycling. The coated nickel sample 710 depicted in FIGS. 7A and 7B has a smaller amount of nickel oxide (e.g., about 5 nm or less) at the interface between the nickel surface and alumina coat 720 as compared to the amount of nickel oxide at the interface of the samples depicted in FIGS. 6A-6F (e.g., about 10-15 nm), which were subjected to ozone pre-treatment. FIG. 7B shows some improvement of the integrity of the alumina coat and its adhesion to the nickel surface after thermal cycling. However, voids (sections V) are still visible in the nickel/nickel oxide interface.

Figure 8A:
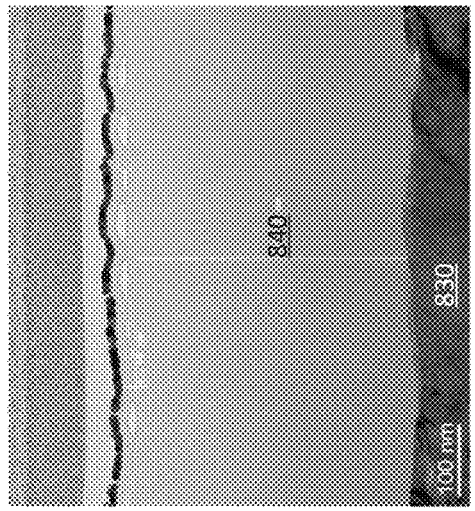
FIG. 8A depicts a TEM cross-section image, at 100 nm scale, of a nickel surface coated with alumina deposited by a dry ALD process, without ozone treatment and with nickel oxide reduction, after thermal cycling.

FIG. 8A depicts a TEM image, at 100 nm scale, of a cross-sectional view of a nickel surface 810 coated with alumina 820, without ozone treatment and with nickel oxide reduction, after the sample had been subjected to thermal cycling. The nickel oxide reduction was performed on the sample depicted in FIG. 8A to further reduce the amount of nickel oxide on the surface (as compared to the amount of nickel oxide at the interface of the samples depicted in FIGS. 6A-6F and FIGS. 7A-7B). The alumina coat in FIG. 8A was deposited using a dry alumina ALD process. FIG. 8A shows that the alumina coat deposited by a dry ALD process maintains its integrity and its adhesion to the nickel surface after thermal cycling.

Figure 8B:
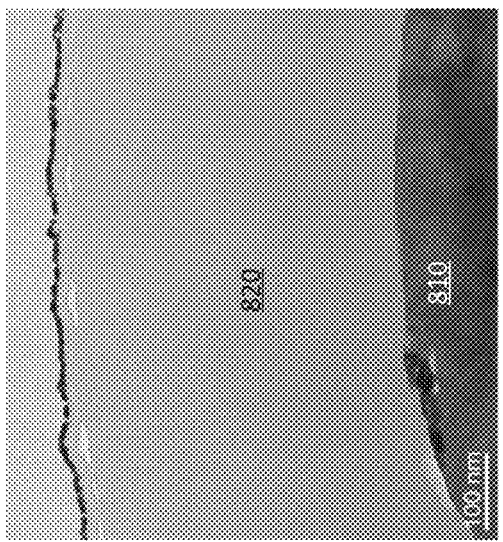
FIG. 8B depicts a TEM cross-section image, at 100 nm scale, of a nickel surface coated with alumina deposited by a wet ALD process, without ozone treatment and with nickel oxide reduction, after thermal cycling.

FIG. 8B depicts a TEM image, at 100 nm scale, of a cross-sectional view of a nickel surface 830 coated with alumina 840, without ozone treatment and with nickel oxide reduction, after the sample had been subjected to thermal cycling. The nickel oxide reduction was performed on the sample depicted in FIG. 8B to further reduce the amount of nickel oxide on the surface (as compared to the amount of nickel oxide at the interface of the samples depicted in FIGS. 6A-6F and FIGS. 7A-7B). The difference between the sample depicted in FIG. 8A and the sample depicted in FIG. 8B is that the alumina coat in FIG. 8B was deposited using a wet alumina ALD process. FIG. 8B shows that the alumina coat deposited by a wet ALD process also maintains its integrity and its adhesion to the nickel surface after thermal cycling.

As shown in FIGS. 8A and 8B, reduction of the nickel oxide content on the surface helps in maintaining the integrity of the coating (i.e., corrosion resistant film) and its adhesion to the surface after thermal cycling regardless of whether the coating is deposited using a dry ALD process or a wet ALD process.

In certain embodiments, improvement of corrosion resistant film integrity and/or adhesion to the metal surface may be achieved by further reducing the amount of metal oxide on the metal surface. For instance, the amount of metal oxide on the surface may be reduced with one or more reduction cycles, such as, introduction of an alcohol reductant to the metal surface. The amount of metal oxide on the surface may also be reduced by depositing the corrosion resistant film through a "dry ALD process." A "dry ALD process" may use an alcohol reactant to oxidize the adsorption metal layer instead of a water reactant.

The effect of the amount of metal oxide on the integrity of a corrosion resistant film was also studied on nickel coupons. Five samples were prepared, namely: 1) as received bare nickel coupon, 2) a reduced nickel coupon, 3) a nickel coupon with an alumina coat deposited by a "wet ALD process" (i.e., a process where the oxidative reactant was water), 4) a reduced nickel coupon with an alumina coat deposited by a wet ALD process, and 5) a reduced nickel coupon with an alumina coat deposited by a "dry ALD process."

The reduction was performed on samples 2, 4, and 5 by 40 purge/pulse cycles. An inert gas (such as nitrogen or argon) were used to purge the coupon reactor for about 20 seconds. Thereafter, t-butanol was pulsed into the reaction chamber for about 0.5 seconds. The amount of t-butanol that was consumed was about 8 mg per pulse. The temperature of the reaction chamber was about 350° C. The pressure of the reaction chamber was set to about 1.5 Torr.

The ALD processes (both—wet and dry) utilized TMA as the aluminum-containing precursor. The wet ALD process performed on samples 3 and 4 utilized water as the wet oxidative reactant. The dry ALD process performed on sample 5 utilized t-butanol as the dry oxidative reactant. Each cycle in the ALD processes (both—wet and dry) included about 0.2 seconds of an aluminum-containing precursor pulse (TMA), followed by about 15 seconds purge with an inert gas (such as nitrogen or argon), followed by about 0.2 second of an oxidative reactant (water for the wet ALD process or t-butanol for the dry ALD process), followed by about 20 seconds purge with an inert gas (such as nitrogen or argon). The temperature of the reaction chamber was about 350° C. The pressure of the reaction chamber was set to about 1.5 Torr. A total of about 3400 dry ALD cycles were performed on sample 5 to reach an alumina coat that is about 250 nm thick. A total of about 3365 wet ALD cycles were performed on samples 3 and 4 to reach an alumina coat that is about 250 nm thick.

Analysis of samples 1-5 showed that nickel oxide species are absent in samples that have undergone reduction prior to ALD of a corrosion resistant film.

In the foregoing description, numerous specific details are set forth, such as specific materials, dimensions, processes parameters, etc., to provide a thorough understanding of the present disclosure. The particular features, structures, materials, or characteristics may be combined in any suitable manner in one or more embodiments. The words "example" or "exemplary" are used herein to mean serving as an example, instance, or illustration. Any aspect or design described herein as "example" or "exemplary" is not necessarily to be construed as preferred or advantageous over other aspects or designs. Rather, use of the words "example" or "exemplary" is simply intended to present concepts in a concrete fashion. As used in this application, the term "or" is intended to mean an inclusive "or" rather than an exclusive "or". That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. Reference throughout this specification to "an embodiment", "certain embodiments", or "one embodiment" means that a particular feature, structure, or characteristic described in connection with the embodiment is included in at least one embodiment. Thus, the appearances of the phrase "an embodiment", "certain embodiments", or "one embodiment" in various places throughout this specification are not necessarily all referring to the same embodiment.

The present disclosure has been described with reference to specific exemplary embodiments thereof. The specification and drawings are, accordingly, to be regarded in an illustrative rather than a restrictive sense. Various modifications of the disclosure in addition to those shown and described herein will become apparent to those skilled in the art and are intended to fall within the scope of the appended claims.

What is claimed is:

1. A coated chamber component comprising:
    a body having a reduced metal surface, wherein the reduced metal surface is uninterrupted across a length or a width of at least a first surface of the body, the reduced metal surface comprising less base metal oxide as compared to a metal oxide amount of a metal surface that has not been reduced; and
    a conformal corrosion resistant film coated on at least a portion of the reduced metal surface.

2. The coated chamber component of claim 1, wherein the reduced metal surface comprises at least one of nickel, copper, cobalt, chromium, stainless steel, molybdenum, ruthenium, tungsten, or platinum.

3. The coated chamber component of claim 1, wherein the metal oxide comprises at least one of nickel oxide, nickel hydroxide, copper oxide, copper hydroxide, cobalt oxide, cobalt hydroxide, chromium oxide, chromium hydroxide, molybdenum oxide, molybdenum hydroxide, ruthenium oxide, ruthenium hydroxide, tungsten oxide, tungsten hydroxide, platinum oxide, platinum hydroxide, or a mixture thereof.

4. The coated chamber component of claim 1, wherein the corrosion resistant film comprises at least one of aluminum oxide, yttrium oxide, zirconium oxide, $Y_3Al_5O_{12}$, a solid solution of $Y_2O_3$—$ZrO_2$, a compound comprising $Y_4Al_2O_9$ and a solid solution of $Y_2O_3$—$ZrO_2$, $HfO_2$, $HfAlO_x$, $HfZrO_x$, $HfYO_x$, erbium oxide, gadolinium oxide, lanthanum oxide, praseodymium oxide, neodymium oxide, promethium oxide, samarium oxide, europium oxide, terbium oxide, dysprosium oxide, holmium oxide, thulium oxide, ytterbium oxide, or lutetium oxide.

5. The coated chamber component of claim 1, wherein the coated chamber component is a showerhead, a substrate support assembly, a chuck, a ring, a chamber wall, a base, a gas line, a gas distribution plate, a face plate, a nozzle, a lid, a liner, a liner kit, a shield, a plasma screen, a remote plasma source, a flow equalizer, a cooling base, a chamber viewport, a ceramic insulator, a quartz insulator, or a chamber lid.

6. The coated chamber component of claim 1, wherein an interface formed between the reduced metal surface and the corrosion resistant film is at least one of void free or porosity free.

7. The coated chamber component of claim 1, wherein the reduced metal surface comprises a metal oxide coat that has a thickness of about 10 nm.

8. The coated chamber component of claim 1, wherein the reduced metal surface comprises about 1-10 wt % less base metal as compared to the metal oxide amount of the metal surface that has not been reduced.

9. The coated chamber component of claim 1, wherein the reduced metal surface comprises less than 5 atom % oxygen.

10. The coated chamber component of claim 1, wherein the corrosion resistant film has a uniform thickness across the portion of the reduced metal surface.

11. The coated chamber component of claim 1, wherein the corrosion resistant film has a first roughness that matches a second roughness of the reduced metal surface.

12. The coated chamber component of claim 1, wherein a ratio of thickness of the corrosion resistant film to thickness of the base metal oxide is between 10,000:1 and 5:1.

13. The coated chamber component of claim 12, wherein the thickness of the corrosion resistant film is greater than the thickness of the base metal oxide.

14. The coated chamber component of claim 1, wherein the body comprises one or more gas conduit holes, and wherein the corrosion resistant film is coated on a surface of the one or more gas conduit holes.

15. The coated chamber component of claim 1, wherein an erosion rate of the corrosion resistant film is less than about 100 nm/RFHr.

16. The coated chamber component of claim 1, wherein the reduced metal surface is an interior surface of the body.

17. The coated chamber component of claim 1, wherein the body comprises at least one of silicon, silica, silicon nitride, doped silicon, germanium, gallium arsenide, glass, sapphire, metal, metal nitride, or metal alloy.

18. The coated chamber component of claim 1, wherein the corrosion resistant film has a thickness between about 1 nm and about 1000 μm.

19. A process chamber comprising:
    a plasma generation unit; and
    a coated chamber component, wherein the coated chamber component comprises:
        a body having a reduced metal surface, wherein the reduced metal surface is uninterrupted across a length or a width of at least a first surface of the body, the reduced metal surface comprising less base metal oxide as compared to a metal oxide amount of a metal surface that has not been reduced; and
        a conformal corrosion resistant film coated on at least a portion of the reduced metal surface.

20. The process chamber of claim 19, wherein the reduced metal surface comprises at least one of nickel, copper, cobalt, chromium, stainless steel, molybdenum, ruthenium, tungsten, or platinum.

* * * * *